(12) United States Patent
Lin

(10) Patent No.: US 8,247,757 B2
(45) Date of Patent: Aug. 21, 2012

(54) CONTACT IMAGE SENSOR MODULE WITH WEDGE-SHAPED GLASS PLATE FOR GUIDING LIGHT

(75) Inventor: I-Thun Lin, Tu-Cheng (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 395 days.

(21) Appl. No.: 12/648,378

(22) Filed: Dec. 29, 2009

(65) Prior Publication Data

US 2011/0155889 A1 Jun. 30, 2011

(51) Int. Cl.
*G01J 1/04* (2006.01)
*H01L 27/00* (2006.01)
(52) U.S. Cl. .................. 250/227.11; 250/208.1
(58) Field of Classification Search .......... 250/208.1, 250/221, 216, 227.11, 227.2, 227.22, 227.24, 250/227.25, 227.27, 227.28, 227.29, 227.31, 250/227.32, 573–575; 385/12; 358/505, 358/509–511, 513, 514, 474, 480, 482–484; 356/436, 445; 340/601–604; 73/29.01, 861.41
See application file for complete search history.

(56) References Cited

U.S. PATENT DOCUMENTS
2010/0302196 A1* 12/2010 Han et al. .................. 345/173

FOREIGN PATENT DOCUMENTS
JP  10-257247  *  9/1998

* cited by examiner

*Primary Examiner* — Pascal M Bui Pho
(74) *Attorney, Agent, or Firm* — Altis Law Group, Inc.

(57) ABSTRACT

A contact image sensor module includes an image sensor, a lens unit arranged over the image sensor, a glass plate arranged over the lens unit, and a light source. The lens unit includes a plurality of rod lenses. The glass plate is wedge-shaped and elongated. The glass plate includes a first light interface being rectangular and elongated, and a second light interface and an incident face respectively extending from two opposite longer sides of the first light interface. The incident face faces the light source. The first light interface is substantially perpendicular to the rod lenses. The second light interface is below the first light interface and faces top sides of the rod lenses. Light of the light source is first directed by the glass plate to the document, then reflected by the document to the lens unit via the glass plate and finally reaching the image sensor.

20 Claims, 4 Drawing Sheets

CONTACT IMAGE SENSOR MODULE WITH WEDGE-SHAPED GLASS PLATE FOR GUIDING LIGHT

BACKGROUND

1. Technical Field

The present disclosure relates generally to contact image sensing modules, and more particularly to a contact image sensor module with an improved glass plate and an improved light source.

2. Description of Related Art

It is well known that contact image sensors are cheap and easy to build, compared with charge couple devices, and are highly competitive in the low resolution and low price markets, such as home scanners and fax machines. A contact image sensing module of a scanner works by directing light emitted from a light source onto the scanned document, and then the light is reflected from the document onto a lens unit. The reflected light is then focused through the lens unit to form an image in a contact image sensor, and thus corresponding image signals are generated.

Usually, a glass plate is utilized to improve a uniformity of the light on the document. However, the glass plate is generally cuboid with an emitting surface and an incident surface formed at two opposite sides thereof, respectively. The light source is arranged below the glass plate and near a side of the glass plate. Thus a large distance must be kept between the glass plate and the light source for obtaining desired uniformity of the light through the glass plate. Thus the contact image sensing module occupies a large space, which conflicts with the requirement for light weight and compactness.

What is needed, therefore, is a contact image sensing module which can overcome the above limitations.

DETAILED DESCRIPTION

Figure 1:
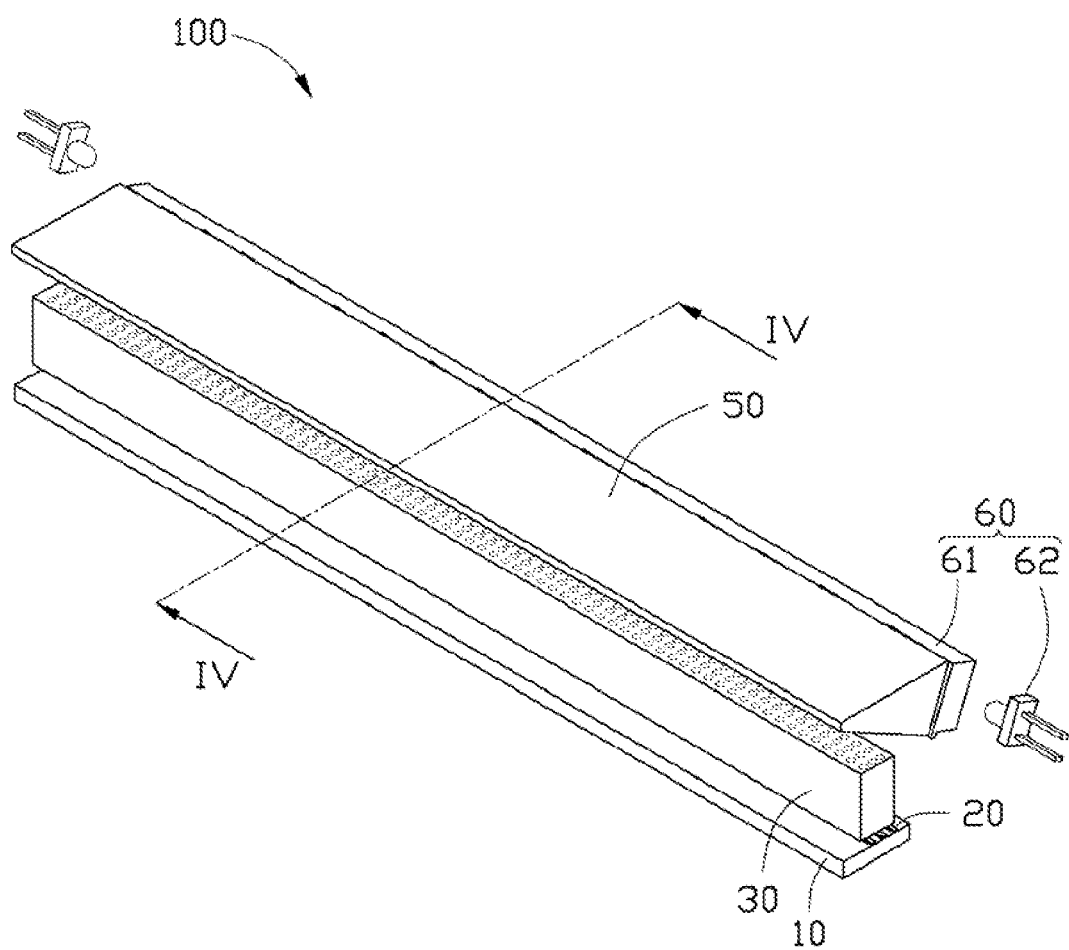
FIG. 1 is a schematic view of a contact image sensing module according to an exemplary embodiment.

Referring to FIG. 1, a contact image sensing (CIS) module 100 according to an exemplary embodiment includes a circuit board 10, an image sensor 20, a lens unit 30, a glass plate 50, and a light source 60. The CIS module 100 can be used in scanners, fax machines, and so on. The circuit board 10, the image sensor 20, the lens unit 30, the glass plate 50 and the light source 60 of the CIS module 100 all are accommodated inside a shell (not shown) of the scanner or the fax machine.

Figure 2:
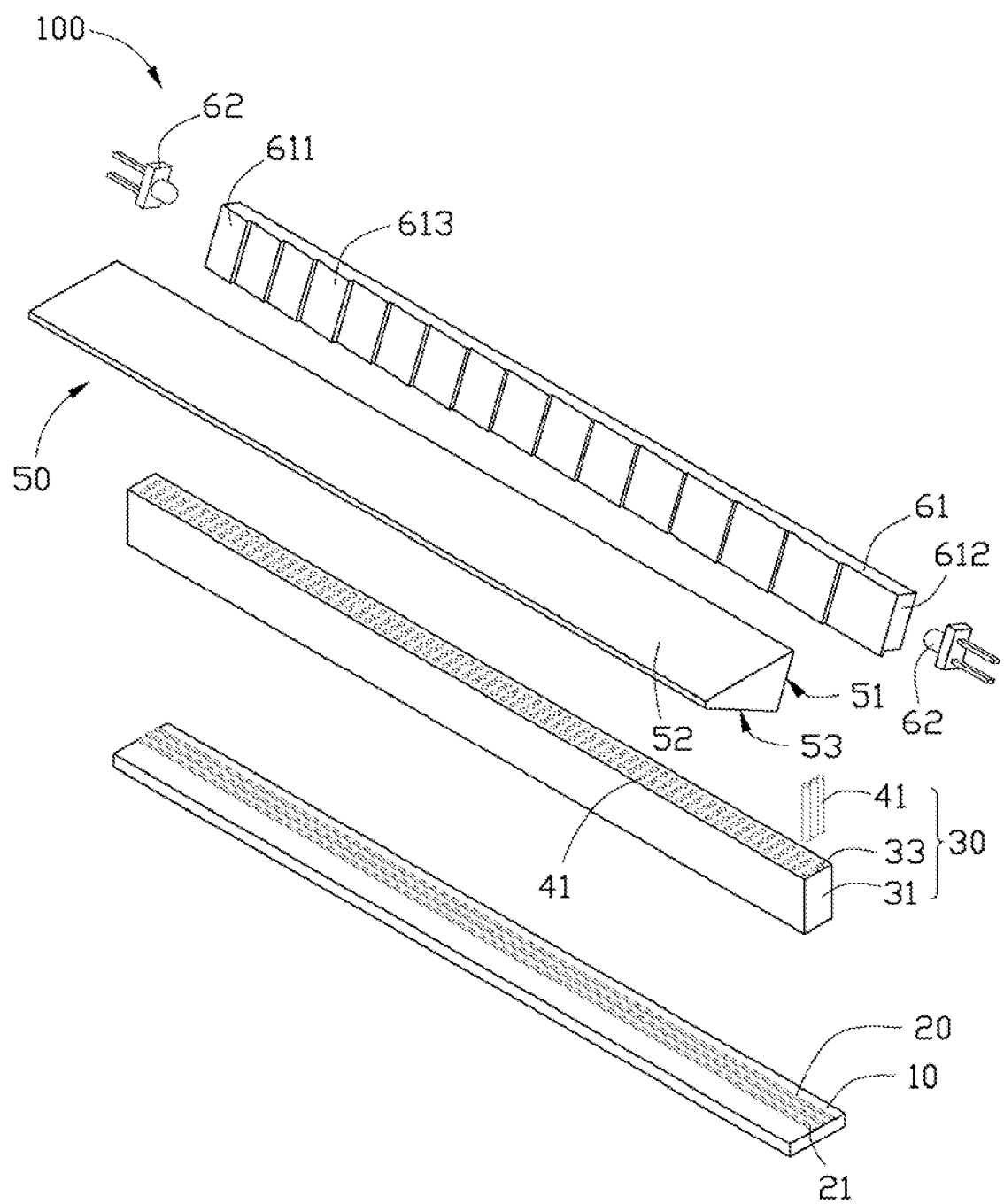
FIG. 2 is an exploded view of the contact image sensing module of FIG. 1.
Figure 3:
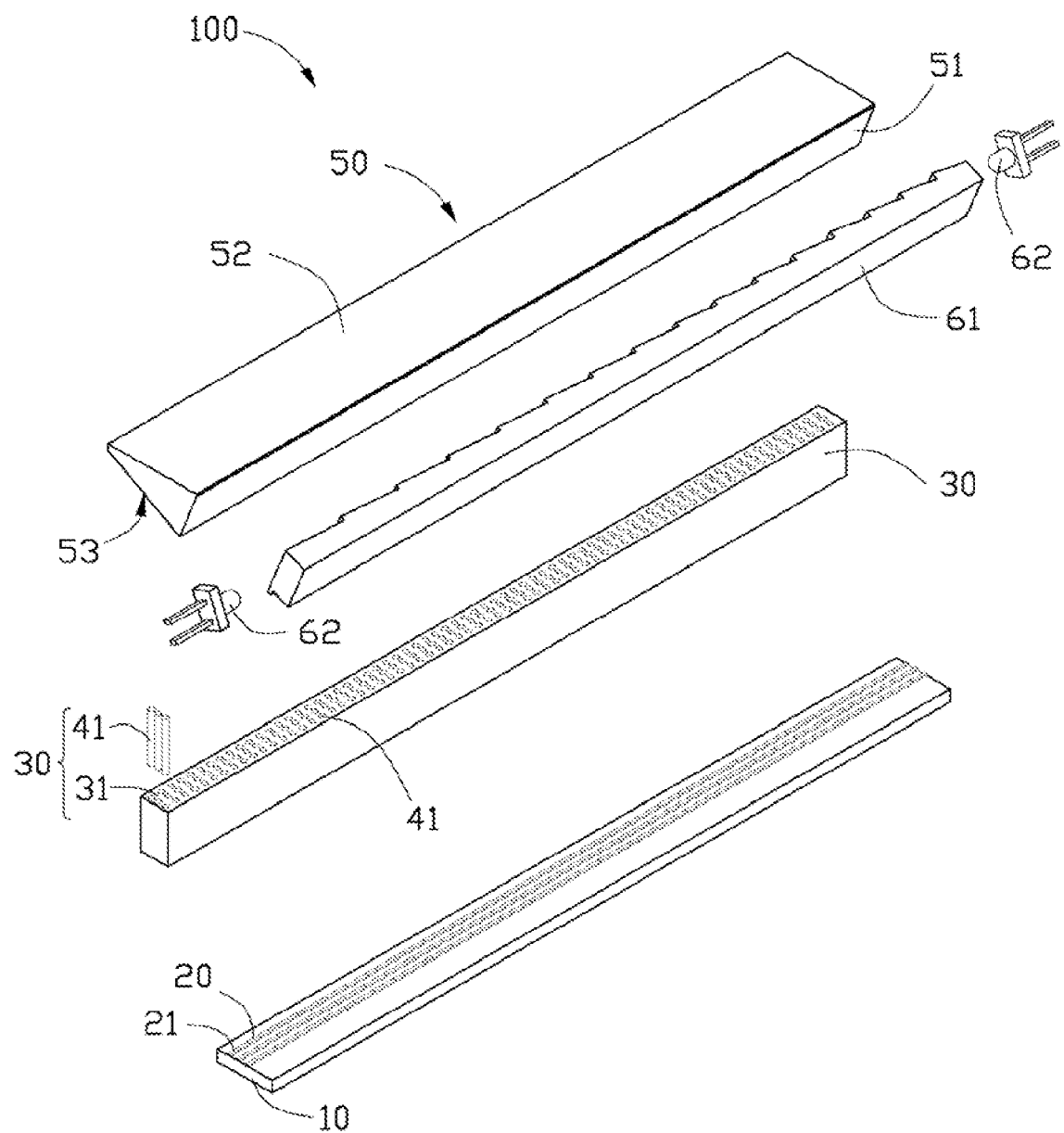
FIG. 3 is similar to FIG. 2, but shows the contact image sensing module from another aspect.

Referring to FIGS. 2 and 3, the circuit board 10 is rectangular and elongated. A plurality of circuits (not shown) are formed on the circuit board 10. The image sensor 20 is arranged on the circuit board 10. The image sensor 20 includes a plurality of image-sensing elements 21. The image-sensing elements 21 are substantially evenly distributed on the circuit board 10, and are electrically connected to the circuits of the circuit board 10. In this embodiment, the image-sensing elements 21 are arranged in three parallel lines.

The lens unit 30 is arranged over and parallel to the circuit board 10. The lens unit 30 includes a holder 31 and a plurality of rod lenses 41 received in the holder 31. The rod lenses 41 each are column-shaped. The holder 31 is cuboid and elongated. A length of the holder 31 is approximately equal to that of the circuit board 10. A cross section of the holder 31 is rectangular. A plurality of through holes 33 extend through the holder 31 along a direction perpendicular to the circuit board 10. An amount of the through holes 33 is the same as that of the image-sensing elements 21 of the image sensor 20. The through holes 33 are arranged in three lines as the image-sensing elements 21. Each through hole 33 receives one of the rod lenses 41 therein. Each rod lens 41 is positioned over and in line with a corresponding image-sensing element 21.

The glass plate 50 is arranged over the lens unit 30. The glass plate 50 is elongated and wedge-shaped. A cross section of the glass plate 50 is substantially triangle. The glass plate 50 includes an incident face 51, a first light interface 52 and a second light interface 53. The first light interface 52 is rectangular and elongated. The first light interface 52 is arranged parallel to a top face of the holder 31 of the lens unit 30, and thus are perpendicular to the rod lenses 41 of the lens unit 30. The second light interface 53 extends downward and slantwise from one longer side of the first light interface 52, which is located near the lens unit 30, compared with the other longer side of the first light interface 52. The second light interface 53 faces the lens unit 30, and is slantwise relative to the lens unit 30.

The incident face 51 of the glass plate 50 extends downward and slantwise from the other longer side of the first light interface 52 to connect a longer side of the second light interface 53, which is located far from the lens unit 30, compared with the other longer side of the second light interface 53. The second light interface 53 slants downwardly toward the lens unit 30 from the other longer side to the longer side thereof. A first acute angle $\alpha$ is defined between the first light interface 52 and the second light interface 53, a second acute angle $\beta$ is defined between the first light interface 52 and the incident face 51, and a third acute angle $\gamma$ is defined between the incident face 51 and the second light interface 53. The first acute angle $\alpha$ is less than the second acute angle $\beta$, and the second acute angle $\beta$ is less than the third acute angle $\gamma$. A thickness of the glass plate 50 decreases outward from the incident face 51 to the joint between the first and second light interfaces 52, 53, which is located near the lens unit 30.

The light source 60 includes a guide plate 61 and a plurality of LEDs 62. The guide plate 61 is arranged parallel to the incident face 51 of the glass plate 50. The guide plate 61 includes an emitting surface 611 attaching to the incident face 51 of the glass plate 50 and a pair of incident surfaces 612. The emitting surface 611 of the guide plate 61 is the same as the incident face 51 of the glass plate 50 in profile and size. A serrated structure 613 is formed on the emitting surface 611 for enhancing a light diffusion effectiveness of the light guide plate 61. Alternatively, the emitting surface 611 of the guide plate 61 can have a plurality of micro-dots formed thereon for enhancing the light diffusion effectiveness. The pair of incident surfaces 612 extend perpendicularly from opposite shorter sides of the emitting surface 611, respectively.

The LEDs 62 are used to generate white light. Such white light can be directly obtained from white LEDs or indirectly obtained by mixing up lights of red, green and blue LEDs or mixing up lights of blue LEDs and phosphor. The LEDs 62 are arranged adjacent to the incident surfaces 612 of the guide plate 61. For simplification, the drawings show only one LED 62 confronting each incident surface 612. It should be understood that the number of the LEDs 62 can be changed according to need.

Figure 4:
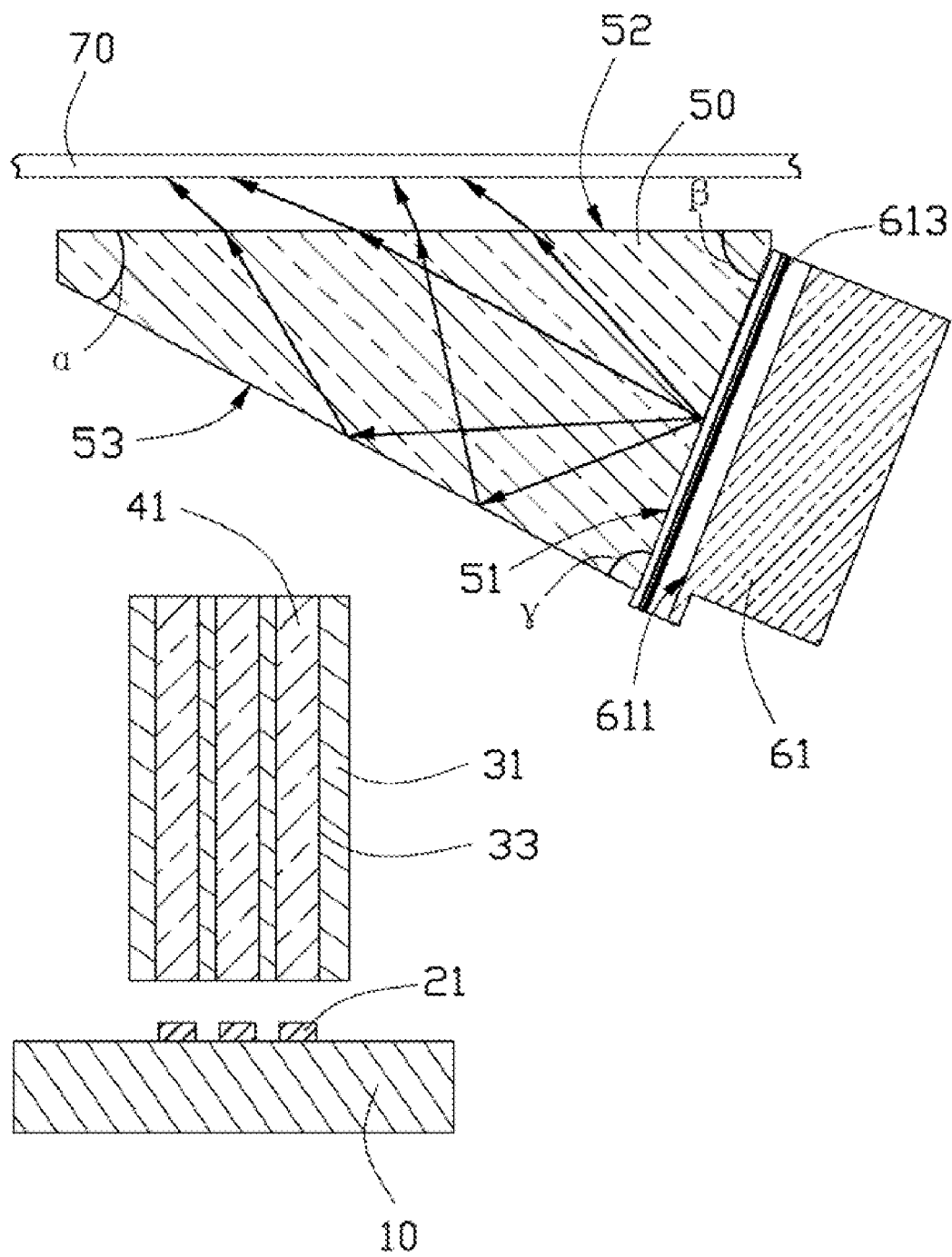
FIG. 4 is a cross sectional view of the contact image sensing module, taken along line IV-IV of FIG. 1.

FIG. 4 shows the CIS module 100 being used to scan a document 70 which is arranged at a top side of the first light interface 52 of the glass plate 50. The light generated by the LEDs 62 travels through the incident surfaces 612 into the guide plate 61, and then travels out of the guide plate 61 via the emitting surface 611. The light emitting out of the guide plate 61 is uniform, just like a surface light source. The light emitting out of the guide plate 61 then travels into the glass plate 50 via the incident face 51. For the wedge-shaped glass plate 50, a part of the light in the glass plate 50 travels through the first light interface 52 of the glass plate 50 directly to illuminate the document 70, and the other part of the light is reflected by the second light interface 53 towards the first light interface 52 and then out of the glass plate 50 to illuminate the document 70.

Then the light illuminated on the document 70 is reflected into the glass plate 50 via the first light interface 52, and finally travels out of the glass plate 50 via the second light interface 53 towards the lens unit 30. The light towards the lens unit 30 is focused by the rod lenses 41 of the lens unit 30 to form an image in the image sensor 20 corresponding to the document 70. Finally image signals are generated by the circuits of the circuit board 10 corresponding to the image formed in the image sensor 20.

For the present CIS module 100, since the glass plate 50 is wedge-shaped, almost all of the light of the light source 60 can travel through the glass plate 50 to illuminate the document 70, and thus the light source 60 can be arranged closer to the incident face 51 of the glass plate 50. Accordingly, a space occupied by the CIS module 100 is small, which can satisfy the requirement of light weight and compactness. In addition, the other part of the light in the glass plate 50 is firstly reflected by the second light interface 53 and then to the first light interface 52. Thus the light out of the glass plate 50 to the document 70 is highly uniform, and thus the light can illuminate a large area of the document 70. Accordingly, a scanning speed and quality of the scanner with the CIS module 100 are high.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A contact image sensor module, comprising:
an image sensor;
a wedge-shaped glass plate comprising an incident face, a first light interface and a second light interface;
a lens unit arranged between the image sensor and the second light interface of the glass plate, the lens unit comprising a holder and a plurality of rod lenses received in the holder; and
a light source facing the incident face of the glass plate for radiating light to the glass plate via the incident face, a part of the light travelling out of the glass plate via the first light interface directly, and the other part of the light reflected by the second light interface and then travelling out of the glass plate via the first light interface;
wherein the first light interface of the glass plate is substantially parallel to a top face of the holder of the lens unit, the second light interface is oriented slantwise to and extends away from a first side of the first light interface, and the light incident face is oriented slantwise to and extends away from an opposite second side of the first light interface and connects to the second light interface.

2. The contact image sensor module of claim 1, wherein the light source comprises a guide plate and a plurality of light emitting diodes (LEDs).

3. The contact image sensor module of claim 2, wherein the guide plate comprises an elongated emitting surface facing the glass plate and a pair of incident surfaces extending from two shorter sides of the emitting surface, the LEDs confronting the incident surfaces of the guide plate.

4. The contact image sensor module of claim 3, wherein a serrated structure is formed on the emitting surface of the guide plate.

5. The contact image sensor module of claim 1, wherein the plurality of rod lenses are arranged perpendicular to the first light interface of the glass plate, the holder defines a plurality of through holes therein, and the rod lenses are received in the through holes of the holder, respectively.

6. The contact image sensor module of claim 1, wherein a first acute angle is defined between the first light interface and the second light interface, a second acute angle is defined between the first light interface and the incident face, and a third acute angle is defined between the incident face and the second light interface.

7. The contact image sensor module of claim 6, wherein the first acute angle is less than the second acute angle, and the second acute angle is less than the third acute angle.

8. The contact image sensor module of claim 1, wherein the lens unit is located beneath and aligned with the glass plate but is nearer the first side of the first light interface than the second side of the first light interface.

9. The contact image sensor module of claim 1, further comprising a circuit board, wherein the image sensor is arranged on and electrically connected to the circuit board, and the image sensor comprises a plurality of image-sensing elements substantially evenly distributed on the circuit board.

10. The contact image sensor module of claim 9, wherein the image-sensing elements are arranged in multiple parallel lines on the circuit board, the lens unit comprises a plurality of rod lenses that are also arranged in multiple parallel lines, and each rod lens is positioned over and aligned with a corresponding one of the image-sensing elements.

11. A contact image sensor module for reading information of a document, comprising:
an image sensor;
a lens unit arranged over the image sensor and comprising a plurality of rod lenses;
a light source for generating light; and
a glass plate arranged over the lens unit, the glass plate being wedge-shaped and elongated, and comprising a first light interface being rectangular and elongated, and a second light interface and an incident face respectively extending away from two opposite longer sides of the first light interface, the incident face facing the light source, the first light interface being substantially perpendicular to each of the rod lenses of the lens unit, the second light interface being located below the first light interface and facing top sides of the rod lenses, the light generated by the light source being first directed by the glass plate to the document, then reflected by the document to the lens unit via the glass plate and finally reaching the image sensor via the lens unit to read the information of the document on the image sensor;

wherein the second light interface is oriented slantwise to and extends away from a first side of the first light interface, and the light incident face is oriented slantwise to and extends away from an opposite second side of the first light interface and connects to the second light interface.

12. The contact image sensor module of claim 11, wherein a longer side of the second light interface away from the lens unit and a bottom side of the incident face of the glass plate joint together, and a thickness of the glass plate decreases along a direction from the incident face toward a join between the first and second light interfaces.

13. The contact image sensor module of claim 12, wherein a first acute angle is defined between the first light interface and the second light interface, a second acute angle is defined between the first light interface and the incident face, and a third acute angle is defined between the incident face and the second light interface.

14. The contact image sensor module of claim 13, wherein the first acute angle is less than the second acute angle, and the second acute angle is less than the third acute angle.

15. The contact image sensor module of claim 11, wherein the light source comprises a guide plate and a plurality of light emitting diodes (LEDs), the guide plate comprising an elongated emitting surface attaching to the incident face of the glass plate and a pair of incident surfaces extending from two shorter sides of the emitting surface, the LEDs confronting the incident surfaces of the guide plate.

16. The contact image sensor module of claim 15, wherein a light diffusion structure is formed on the emitting surface of the guide plate, and the light diffusion structure is a serrated structure or a micro-dots structure.

17. The contact image sensor module of claim 11, wherein the light generated by the light source and directed by the glass plate to the document has a part moving through the incident face first and then through the first light interface to the document, and another part moving through the incident face first, then reflected by the second light interface and finally through the first light interface to the document.

18. The contact image sensor module of claim 11, wherein the lens unit is located beneath and aligned with the glass plate but is nearer the first side of the first light interface than the second side of the first light interface.

19. The contact image sensor module of claim 11, further comprising a circuit board, wherein the image sensor is arranged on and electrically connected to the circuit board, and the image sensor comprises a plurality of image-sensing elements substantially evenly distributed on the circuit board.

20. The contact image sensor module of claim 19, wherein the image-sensing elements are arranged in multiple parallel lines on the circuit board, the rod lenses of the lens unit are also arranged in multiple parallel lines, and each rod lens is positioned over and aligned with a corresponding one of the image-sensing elements.

* * * * *